(12) United States Patent
Mizuno et al.

(10) Patent No.: US 7,858,479 B2
(45) Date of Patent: Dec. 28, 2010

(54) METHOD AND APPARATUS OF FABRICATING SEMICONDUCTOR DEVICE

(75) Inventors: Bunji Mizuno, Nara (JP); Yuichiro Sasaki, Tokyo (JP); Ichiro Nakayama, Osaka (JP); Hiroyuki Ito, Chiba (JP); Tomohiro Okumura, Osaka (JP); Cheng-Guo Jin, Osaka (JP); Katsumi Okashita, Tokyo (JP); Hisataka Kanada, Osaka (JP)

(73) Assignee: Panasonic Corporation, Osaka (JP)

( * ) Notice: Subject to any disclaimer, the term of this patent is extended or adjusted under 35 U.S.C. 154(b) by 82 days.

(21) Appl. No.: 11/596,372

(22) PCT Filed: May 12, 2005

(86) PCT No.: PCT/JP2005/008695

§ 371 (c)(1),
(2), (4) Date: Nov. 14, 2006

(87) PCT Pub. No.: WO2005/112088

PCT Pub. Date: Nov. 24, 2005

(65) Prior Publication Data

US 2007/0212837 A1     Sep. 13, 2007

(30) Foreign Application Priority Data

May 14, 2004     (JP) .............................. 2004-145388

(51) Int. Cl.
  *H01L 21/8234*     (2006.01)
(52) U.S. Cl. ........................ 438/275; 438/276; 438/513; 257/E21.196; 257/E21.197; 250/492.2; 250/492.21
(58) Field of Classification Search .................. 438/301, 438/513, 706–712; 250/492.2–492.23; 257/E21.196, 257/E21.197
  See application file for complete search history.

(56) References Cited

U.S. PATENT DOCUMENTS

| 4,255,230 | A | * | 3/1981 | Zajac ......................... 438/719 |
| 5,561,072 | A |   | 10/1996 | Saito |
| 5,897,346 | A |   | 4/1999 | Yamaguchi et al. |
| 5,969,398 | A |   | 10/1999 | Murakami |

(Continued)

FOREIGN PATENT DOCUMENTS

EP     1 648 023 A1     4/2006

(Continued)

OTHER PUBLICATIONS

Wolf "Silicon Processing for the VLSI Era, vol. 1", 2000, Lattice Press, 2nd ed., pp. 376-382.*

(Continued)

*Primary Examiner*—Alexander G Ghyka
*Assistant Examiner*—Leonard Chang
(74) *Attorney, Agent, or Firm*—McDermott Will & Emery LLP

(57) ABSTRACT

An object is to provide a semiconductor device in which uniform properties are intended and high yields are provided. Process steps are provided in which variations are adjusted in doping and annealing process steps that are subsequent process steps so as to cancel in-plane variations in a substrate caused by dry etching to finally as well provide excellent in-plane consistency in a substrate.

6 Claims, 4 Drawing Sheets

U.S. PATENT DOCUMENTS

| | | | |
|---|---|---|---|
| 6,025,252 | A | 2/2000 | Shindo et al. |
| 6,042,687 | A * | 3/2000 | Singh et al. ............ 156/345.33 |
| 6,051,482 | A | 4/2000 | Yang |
| 6,096,628 | A * | 8/2000 | Greenlaw et al. ........... 438/530 |
| 6,403,167 | B1 * | 6/2002 | Lee et al. .................... 427/525 |
| 6,465,727 | B2 | 10/2002 | Maruyama et al. |
| 6,653,699 | B1 | 11/2003 | Yang |
| 6,713,819 | B1 | 3/2004 | En et al. |
| 6,821,859 | B2 * | 11/2004 | Raebiger et al. ........... 438/303 |
| 2002/0069966 | A1 * | 6/2002 | Elliott et al. ............. 156/345.5 |
| 2003/0015660 | A1 | 1/2003 | Shishido et al. |
| 2003/0153194 | A1 * | 8/2003 | He et al. ..................... 438/714 |
| 2003/0193066 | A1 | 10/2003 | Ito et al. |
| 2003/0211670 | A1 | 11/2003 | Downey |
| 2005/0227463 | A1 | 10/2005 | Ito et al. |
| 2006/0205192 | A1 | 9/2006 | Walther et al. |
| 2006/0264051 | A1 | 11/2006 | Thibaut |

FOREIGN PATENT DOCUMENTS

| | | |
|---|---|---|
| JP | 58-97863 | 6/1983 |
| JP | 5-206045 | 8/1993 |
| JP | 5-206053 | 8/1993 |
| JP | 6-310533 | 11/1994 |
| JP | 8-64796 | 3/1996 |
| JP | 9-17867 | 1/1997 |
| JP | 9-199719 | 7/1997 |
| JP | 11-233450 | 8/1999 |
| JP | 2003-173948 | 6/2003 |
| JP | 2003-528462 | 9/2003 |
| WO | WO 98/34268 | 8/1998 |

OTHER PUBLICATIONS

International Search Report corresponding to application No. PCT/JP2004/001473 dated Apr. 13, 2004.

D. Lenoble et al., "Reliable and enhanced performances of sub-0.1 μm pMOSFETs doped by low biased Plasma Doping", 2000 Symposium on VLSI Technology Digest of Technical Papers, IEEE, pp. 110-1111, 2000.

Y. Kiyota, "Surface Reaction Doping using Gas Source for Ultra Shallow Junctions", Japan Society of Applied Physics, 2000.

Y. Kiyota, et al., "Role of hydrogen during rapid vapor-phase doping analyzed by x-ray photoelectron spectroscopy and Fourier-transform infrared-attenuated total reflection", Journal of Vacuum Science and Technology A 16 (1), pp. 1-5, Jan./Feb. 1998.

Y. Kiyota, "Surface Reaction Doping using Gas Source for Ultra Shallow Junction", Silicon Technology No. 39, pp. 9-11, Jun. 2002.

Y. Sasaki et al., "Gas Phase Doping at Room Temperature", Extended Abstracts of International Workshop on Junction Technology, pp. 39-40, 2002.

Y. Sasaki et al., "$B_2H_6$ Plasma Doping with In-situ He Pre-amorphization", 2004 Symposium on VLSI Technology Digest of Technical Papers, pp. 180-181.

Chinese Office Action issued in corresponding Chinese Patent Application No. CN 2004800046349, mailed Mar. 30, 2007.

U.S. Appl. No. 11/153,572.

U.S. Appl. No. 11/819,567.

Ito, T., et al., "Improvement of Threshold Voltage Roll-off by Ultra-shallow Junction Formed by Flash Lamp Annealing", 2003, Symposium on VLSI Technology Digest of Technical Papers.

Yamashita, F., et al., "Direct Joule Heating of Nd-Fe-B Based Melt-Spun Powder and Zinc Binder", 1999, IEEE.

Chu, P.K., et al., "Part one of two, Plasma Doping: Progress and potential", Solid State Technology, Sep. 1999, pp. 55-60, www.solid-state.com.

Chu, P.K., et al., "Part two of two, Plasma Doping: Progress and potential", Solid State Technology, Oct. 1999, pp. 77-82, www.solid-state.com.

Hori, A., et al., "CMOS Device Technology toward 50 nm Region—Performance and Drain Architecture—", IEDM, 1999, pp. 641-644, IEEE.

Kwok, Dixon T.K., et al., "Energy distribution and depth profile in $BF_3$ plasma doping", Surface and Coatings Technology, 2001, pp. 146-150, vol. 136, Elsevier Science B.V.

Yamashita, F., et al., "Nd-Fe-B Thin Arc-shaped Bonded Magnets for Small DC Motors Prepared by Powder Compacting Press with Ion-implanted Punches", J. Mgn. Soc. Japan, 2001, pp. 683-686, vol. 25 No. 4-2.

Yamashita, F., et al., "Preparation of a Solid Rotor Composed of a Highly Dense Ring-Shaped RE Bonded Magnet and an Iron-Dust Core", Trans. Magn. Soc. Japan., 2002, pp. 111-114, vol. 2 No. 3.

Mizuno, B., "Ultra Shallow Junction for sub-50NM CMOS—The role of Plasma Doping-", UJTLab, pp. 10-13, Ultimate Junction Technologies Inc.

Sasaki, Y., et al., "Plasma Doped Shallow Junction Formation", Matsushita Technical Journal, Dec. 2004, pp. 404-409, vol. 50 No. 6.

Tsutsui, K., et al., "Doping Effects from Neutral $B_2H_6$ Gas Phase on Plasma Pretreated Si Substrates as a Possible Process in Plasma Doping", The Japan Society of Applied Physics, 2005, pp. 3903-0907, vol. 44 No. 6A.

Mizuno, B., et al., "De-Excitation Pathways of highly-Excited Self-Trapped Exciton and Electron Plus Self-Trapped Hole", Journal of the Physical Society of Japan, Jun. 1983, pp. 1901-1903, vol. 52 No. 6.

Mizuno, B., "Excitation-Induced Atomic Motion of Self-Trapped Excitons in RbCI: Reorientation and Defect Formation", Journal of the Physical Society of Japan, Sep. 1986, pp. 3258-3271, vol. 55 No. 9.

Mizuno. B., et al., "Effect of Hydrogen on Oxygen Removal from Silicon-Overlayer on Insulator formed by $O^+$ Implantation", pp. 637-640, Semiconductor Research Center, Matsushita Electric Industrial Co., Ltd.

Fujita, T., et al., "Electron Paramagnetic Resonance Studies of Defects in Oxygen-Implanted Silicon", Jaanese Journal of Applied Physics, Jul. 1987, pp. L1116-L1118, vol. 26 No. 7.

Mizuno, B., et al., "Effective removal of oxygen from Si layer on burned oxide by implantation of hydrogen", J. Appl. Phys., Sep. 1987, pp. 2566-2568, vol. 62 No. 6.

Mizuno, B., et al., "New doping method for subhalf micron trench sidewalls by using an electron cyclotron resonance plasma", Appl. Phys. Lett., Nov. 1988, pp. 2059-2061, vol. 53 No. 21, American Institute of Physics.

Shimizu, N., et al., "Reduction of Thickness Secondary Defects in MeV ion Impalted Silicon by Intrinsic Gettering", Extended Abstracts of the 21st Conference on Solid State Devices and Materials, Tokyo, 1989, pp. 177-180.

Hori, A., et al., "A 0.05 μm-CMOS with Ultra Shallow Source/Drain Junctions Fabricated by 5KeV Ion Implantation and Rapid Thermal Annealing", 1994, pp. 485-488, IEDM.

Hori, A., et al., "Fabrication and Characteristics of a Room Temeprature 0.05 μm-CMOS—Possibility and Design Concept of Sub-0.1 μm MOS Devices-", Technical Report of IEICE, 1995, pp. 41-46, The Institute of Electronics, Information and Communication Engineers.

Mizuno, B., et al. " Plasma doping for silicon", Surface and Coatings Technology, 1996, pp. 51-55, vol. 85, Elsevier Science S.A.

Mizuno, B., et al., "Plasma Doping of Boron for Fabricating the Surface Channel Sub-quarter micron PMOSFET", Symposium on VLSI Technology Digest of Technical Papers, 1996, IEEE.

Takase, M., et al., "An evaluation method for a high concentration profile produced in very low energy doping processes", Nuclear Instruments and Methods in Physics Research, 1997, pp. 288-290, vol. 121, Elsevier Science B.V.

Takase, M., et al., "Suppressing Ion Implantation Induced Oxide Charging by Utilizing Physically Damaged Oxide Region", Jpn. J. Appl. Phys., Mar. 1997, pp. 1618-1621, vol. 36 Part 1, No. 3B.

Mizuno. B., et al., "Plasma Doping", pp. 165-170, Central Research Laboratory, Matsushita Electric Industrial Co., Ltd.

Kadokura, M., et al., "Analysis and Design of At-Cut Quartz Resonators by three dimensional finite element method", EEP-vol. 19-1, Advances in Electronic Packaging, 1997, pp. 1101-1108, vol. 1, ASME 1997.

Mizuno. B., et al., "Plasma Doping and Plasma-Less Doping of Semiconductor", Mat. Res. Soc. Symp. Proc., 1997, pp. 345-950, vol. 438, Materials Research Society.

Takase, M., et al, "New Doping Technology-Plasma Doping—for Next Generation CMOS process with Ultra Shallow Junction—LSI Yield and surface contamination issues-", 1997, pabes B9-B12, IEEE.

Takase, M., et al., "Shallow Source/Drain Extensions for pMOSFETs with High Activation and Low Process Damage Fabricated by Plasma Doping", IEDM, 1997, pp. 475-478, IEEE.

Jin, C.G., "Hard X-ray Photoelectron spectroscopy (HX-PES) study on chemical binding states of ultra shallow plasma-doped silicon layer for the application of advanced ULSI devices", 2006, pp. 116-119, IEEE.

Mizuno, B., et al., "Plasma Doping and Subsequent Rapid Thermal Processing for Ultra Shallow Junction Formation", 13th IEEE International Conference on Advanced Thermal Processing of Semiconductors—RTP, 2005, IEEE.

Mizuno, B., et al., "Plasma Doping", 2004, pp. 423-427, IEEE.

Sasaki, Y., et al., "Gas Phase Doping at Room Temperature", Extended Abstract of International Workshop on Junction Technology, 2002, pp. 39-40, Japan Society of Applied Physics.

Sasaki, Y., et al., " Helicon Wave Plasma Doping System", Extended Abstract of International Workshop on Junction Technology, 2002, pp. 37-38, Japan Society of Applied Physics.

Jin, C.G., et al., "Estimation of Ultra-Shallow Plasma Doping (PD) Layer's Optical Absorption Properties by Spectroscopic Ellipsometry (SE)", 2004, pp. 102-103, IEEE.

Shimizu, N., et al., "Secondary Defect Reduction by Multiple MeV Boron Ion Implantation", Extended Abstract of the 22nd (1990 International) Conference on solid State Devices and Materials, Sendai, 1990, pp. 449-452.

Sasaki, Y., et al., "New method of Plasma doping with in-situ Helium pre-amorphization", Nuclear Instruments and Methods in Physics Research B 237, 2005, pp. 41-45, Elsevier B.V.

Jin, C.G., "Ultra shallow $p^+$/n junction formation by plasma doping (PD) and long pulse all solid-state laser annealing (ASLA) with selective absorption modulation", Nuclear Instruments and Methods in Physics Research B 237, 2005, pp. 58-61, Elsevier B.V.

Mizuno, B., et al., "Plasma Doping and Plasma-Less Doping for SI: Application to the sub-quarter micron Surface Channel PMOSFET and Solid Plasma Source Application for Safety Operation", Semiconductor Research Center, Matsushita Electric Industrial Co., Ltd.

Liu, H., et al., "A New Plasma-Aided Solid-Source Implantation Method for Ultra-Shallow p+/n Junction Fabrication", Engineering Research Center for Plasma-Aided Manufacturing, University of Wisconsin-Madison.

Mizuno, B., "Plasma Doping into the Side-Wall of a Sub-0.5 μm Width Trench", Extended Abstracts of the 19th Conference on Solid State Devices and Materials, Tokyo, 1987, pp. 319-322.

Mizuno, B., "Plasma Doping Technology", Applied Physics, 2001, pp. 1458-1462, vol. 70.

Takase, M., et al., "Shallow Source/Drain Extensions for pMOSFETs with High Activation and Low Process Damage Fabricated by Plasma Doping", Technical Report of IEICE, 1998, The Institute of Electronics, Information and Communication Engineers.

Mizuno, et al., "Ultralow Energy Doping Plasma Doping", Special Issue—Currently Developed Ion Engineering Technology-1.

Mizuno, B., et al., "Plasma Based Ion Implantation—Plasma Doping", High Temperature Science Journal, May 1996, pp. 114-120, vol. 3 No. 22.

Tatsumi, T., et al., "Multilevel Interconnection Technology using Fluorinated Amorphous Carbon films", 3p-ZX-3, Silicon Systems Research Laboratories, NEC Corporation.

Mizuno. B., et al., Plasma doping for fabricating ultra shallow junction, 3p-ZX-4, Matsushita Electric Industrial Co., Ltd.

Oda, H., et al., "Demand for Junction Technology in CMOS Transistors", 27a-ZL-1, 49th Applied Physics Lecture Series—Lecture Manuscripts, Comprehensive Lectures within the Area, 2002, Tokai University.

Mizuno, B., et al., "Junction Technologies: Status Quo and Perspectives", 27a-ZL-2, Comprehensive Lectures within the Area.

Hata, N., et al., "Characterization of Low-k Dielectrics by Z-ray Scattering- Anisotropy in Pore Diameter and its Suppression", 26p-M-19, 63rd Applied Physics Lecture Series—Lecture Manuscripts, 2002, Niigaka University.

Shimanuki, J., et al., "Behavior of pores in a thin low-k film during anneal—Ex-situ TEM observation method", 26p-M-20.

Sasaki, Y., et al., "In-situ Beam Current Monitor for Ion Implanter", 25a-G-1, pp. 768.

Higaki, R., et al., "Plasma Doping and Plasma Assisted Gas Doping", 25a-G-2, 63rd Applied Physics Lecture Series—Lecture Manuscripts, 2002, Niigaka University.

Kurosawa, J., et al., "Development of Ni-B-P-Pt type liquid metal ion source for formation of Ni-nano dopant array by single ion implantation", 25a-G-3, 63rd Applied Physics Lecture Series—Lecture Manuscripts, 2002, Niigaka University.

Imamura, K., et al., "Development of key-techniques for co-doping of acceptor and donor by single ion implantation", 25a-G-4, 63rd Applied Physics Lecture Series—Lecture Manuscripts, 2002, Niigaka University.

Yamashita, K., et al., "Development of Flash Lamp Annealer for 300mm Wafers", 29p-ZW-10, 50th Applied Physiscs Lecture Series—Lecture Manuscripts, 2003, Shinagawa University.

Kubo, Y., et al., "Development of advance single ion implanter", 29p-ZW-11, 50th Applied Physiscs Lecture Series—Lecture Manuscripts, 2003, Shinagawa University.

Higaki, R., et al., "Dose Control of gas Phase Doping at Room Temperature" 29p-ZW-12, 50th Applied Physiscs Lecture Series—Lecture Manuscripts, 2003, Shinagawa University.

Akama, S., et al., "The Surface Reaction mechanism of Gas Phase Doping at Room Temperature", 29p-ZW-13, 50th Applied Physiscs Lecture Series—Lecture Manuscripts, 2003, Shinagawa University.

Sasaki, Y., et al., "Behavior of H and contamination in the Plasma Doping (PD) process", 29p-ZW-14, 50th Applied Physiscs Lecture Series—Lecture Manuscripts, 2003, Shinagawa University.

Kurobe, K., et al., "Ultra-shallow n+/p Junction Formation by Heat-assisted Excimer Laser Annealing", 29p-ZW-15, 50th Applied Physiscs Lecture Series—Lecture Manuscripts, 2003, Shinagawa University.

Fujinami, M., et al., "Research in Pores and Oxygen Compound Deficits in Si Due to the Positron Annihilation Coincidence Doppler Broadening Method, Positron Annihilation Coincidence Doppler Broadening Methods for Vacancy-Oxygen Complexes in Si", 1a-A-8, 64th Applied Physics Lecture Series—Lecture Manuscripts, 2003, Fukuoka University.

Miyagoe, T., et al., "Behavior Research on Deficits in Noble Gas Ion Implanted Si Using a Positron Beam, Positron beam study of defects induced by noble gas implanted Si", 1a-A-9, 64th Applied Physics Lecture Series—Lecture Manuscripts, 2003, Fukuoka University.

Higaki, R., et al., " Effects on the Substrate Surface conditions with Gas Doping Having Used Plasma Preprocessing, Effects of substrate surface condition on gas-phase doping using plasma pretreatment", 1a-A-10, 64th Applied Physics Lecture Series—Lecture Manuscripts, 2003, Fukuoka University.

Itoh, H., et al., "Ultra-low energy ion implantation in Si II", 30p-ZQ-9, Preprints of the 67th Meeting of the Japan Society of Applied Physics, 2006, Ritsumeikan University.

Matsuda, T., et al., "Spike RTA Induced Changes in Chemical Bondings and Their Depth Profile of Plasma-doped Boron", 30p-ZQ-10, Preprints of the 67th Meeting of the Japan Society of Applied Physics, 2006, Ritsumeikan University.

Tanaka, Y., et al., "8nm ($5E18cm^{-2}$) Ultra Shallow Junction Formation by Double-Pulsed Green Laser Annealing", 30p-ZQ-11, Preprints of the 67th Meeting of the Japan Society of Applied Physics, 2006, Ritsumeikan University.

Haya, A., et al., "Surface Modification of Plastic Substrate by Atomic Hydrogen Anneal and Effect of AHA to Film Deposition", 29p-SM-1, Preprints of the 54th Meeting of the Japan Society of Applied Physics and Related Societies, 2007, Aoyama Gakuin University.

Ohashi, Y., et al., "Effects of Hydrogenation on Chemical Activity of Defects in Polycrystalline Silicon Thin films", 29p-SM-2, Preprints of the 54th Meeting of the Japan Society of Applied Physics and Related Societies, 2007, Aoyama Gakuin University.

Watanabe, M., et al., "Study of Activated Boron Depth Profiles and Ultra-Shallow P+ Layers Formed by Plasma Doping Method", 29p-SM-3, Preprints of the 54th Meeting of the Japan Society of Applied Physics and Related Societies, 2007, Aoyama Gakuin University.

Ishiba, T., et al., "Lattice Strains in High Energy Ion Implated Silicon Subjected to Thermal Annealings", 27a-SN-13.

Shimizu, N., et al., "Secondary Defect Reduction of Multiple MeV Ion Implatation (II)", 27a-SN-14.

Nakata, J., "The Low-Temperature Crystallization and Amorphization Mechanism of Amorphous Si by High Energy Heavy-Ion Beam Irradiation", 27a-SN-15.

Matsumoto, M., "The Influence of Pre-oxidation Cleaning on Grotwh of Oxide Film (II)", 28a-D-1.

Uchida, H., et al., "Influence of Cleaning methods on Dielectric Breakdown in Thin $Sio_2$," 28a-D-2.

Takiyama, M., et al., " Electrical Characteristics of Al MOS Diode Contaminated with Cu-I", 28a-D-3.

Shimizu, N., et al., "Secondary Defect Reduction of Multiple MeV Ion Implantation (III)", 31a-X-5.

Kimoto, K., et al., "Rapid Thermal Annealing for High-energy Ion Implanted Si (V)" 31a-X-6.

Koyama, Y., et al., "Rapid Thermal Annealing for High-energy Ion Implanted Si (VI)" 31a-X-7.

Suzuki, H., et al., "Preamorphization by si Double Ion Implantation", 9p-C-12.

Takamatsu, H., et al., "Evaluation of Anneal Effect by Photoacoustic Displacement Measurement", 9p-C-13.

Shimizu, N., et al., "Effects of Junction Leakage Current Reduction of Additional High Energy Si Ion Implantation", 9p-C-14.

Katsumoto, M., et al., "The Effect of NH40H/H202 Cleaning on C-V Characteristics of MOS Capacitor", 11p-B-12.

Shinno, H., "Ellipsometric Measurements of Silicon Surfaces During Oxidation in R.F. Plasma", 11p-B-13.

Maekawa, M., et al., "Effect of H2SO4 Boiling on Silicon Surface", 11p-B-14.

Mizuno, B., et al., "Plasma-assisted Impurity Doping for ULSIs", 28p-ZP-10.

Itatani, R., "Introductory Talk, Matrial Processing Induced by Electron Beam", 28p-ZQ-1.

Tanimura, S., et al., D-255 Total Management System for VLSI Manufacturing, 1994 Spring Conference of the Institute of Electronics, Information and Communications Engineers, Matsushita Electric Industrial Co., Ltd.

Maekawa, T., et al., "Annealing of $Ar^+$ Implanted Damage" 30p-ZK-2.

Okahisa, M., et al., "Electrical Properties of High Energy Boron-implanted Layers in Si", 30p-ZK-3.

Shimizu, N., et al., "Effects of n+ Layer Formation on Junction Leakage Current Using High Energy Ion Implantation", 30p-ZK-4.

Kinoshita, K., et al., "Optical Property Change of Silicon in Low Energy Ion Implantation (II)", 28a-ZW-8.

Mizuno, B., et al., "A Sputtering Effect During the Ion Implantation with Low Energy", 28a-ZW-9.

Kagawa, K., et al., "Effect of Charging During Ion Implantation on Devices", 28a-ZW-10.

Murakoshi, A., et al., " Formation of Ultra Shallow Diffusion Layer by Ultra Low Energy Ion Implantation", 26p-ZN-10.

Mizuno, B., et al., "Plasma Doping Method", 26p-ZN-11.

Fukuda, K., et al., "Fabrication of Ultra Shallow Junction by Spin-on Glass $SiO_2$ Film" 26p-ZN-12.

Ishii, M., "Quantitative Analysis of rare-Gas Ion Bombardment Damage of Si Surface using XPS", 26p-ZP-6.

Takase, M., et al., "Evaluation Method of Hifh concentration Profile for Low Energy Ion Implantation", 26p-ZP-7.

Nakamura, T., et al., " Influence of simultaneously Implanted As+ ions on diffusivity and activation efficency of B atoms implanted into silicon", 26p-ZP-8.

Akiyama, H., et al., "The life-time control technique for power devices using high-energy heavy ion radiation", 28a-P-6.

Takase, M., et al., "The Indentification of the Region of Ion Implantation Induced Physical Damaged Layer", 28a-P-7.

Tamura, F., et al., "Measurement of the minority carrier lifetime for the Si epitaxial layer", 28a-P-8.

Mizuno, B., et al., "Room Temperature Vapor Phase Doping (RTVD)", 28p-P-4.

Mizuno, B., et al., "Plasma Doping Applicable to sub-1/4 micron PMOS", 28p-P-5.

Kujirai, H., et al., "Ultra-shallow, low resistance junction formation by solid-phase diffusion of boron from BSG", 28p-P-6.

Takase, M., et al., "Dosage Control by Plasma Emission in Plasma Doping Process", 7a-P-2.

Murakami, E., et al., "Formation of Ultrashallow Junctions by Sb Selective δ Doping Technique", 7a-P-3.

Kiyota, Y., et al., The Role of Hydrogen during Rapid Vapor-phase Doping Analyzed by FTIR-ATR, 7a-P-4.

Takase, M., et al., "Fabrication of Low Sheet Resistance and Shallow Source/Drain Junction with Plasma Doping Process", 29a-G-2.

Shimada, N., et al., "Shallow Junction, Formation by Polyatomic Cluster Ion Implantation", 29a-G-3.

Ishikawa, T., et al., "Formation of shallow junctions by low-energy implantation", 29a-G-4.

Shimada, N., et al., "Shallow Junction Formation by Decaborane Ion Impantation (IV)", 3a-PC-13.

Mineji, A., et al., "Shallow Junction Formation by 0.2 keV-single B Ion Implantation", 3a-PC-14.

Takase, M., et al., " High Activation Ultra Shallow Source/Drain Junction Fabricated by Plasma Doping", 3a-PC-15.

Nishida, S., et al., " The Herzog correction revisited", 7a-YP-8.

Ono, S., et al., "Design of a cryogenic current measuring device using a SQUID for low-intensity beams", 7a-YP-9.

Haruyama, Y., et al., "High resolution measurement of $HeH^+$ dissociative recombination with superconductor electron cooler", 7a-YP-10.

Tsurubuchi, S., et al., "Excitation cross sections for the resonance states of the Ne by electron impact", 7a-YP-11.

Wakabayashi, et al., "IEDM Focusing on high speed and low electric power techniques , Finally the Cu damascene technique for practical applications has arrived", IEDM Conference, 1997, IEEE.

Nakata, K., et al., "Fail Bit map Correlation Analysis System", The Institute of Electronics, Information and Communication Engineers (IEICE) Electronics Society Annual Meeting, 1995.

Tsubo, Y., et al., "Diffusion of Phosphorus from P-doped Polysilicon through Ultrathin siO2 into Si Substrate", 30p-ZP-11.

Aoyama, T., et al., "Boron Diffusion in Silicon Dioxide in the Presence of Hydrogen and Fluorine", 30p-ZP-12.

Takase, M., et al., "Effect of oxide thickness on boron profile in the plasma doping process", 30p-ZP-13.

Mizuno, B., et al., "Plasma Doping", Invitational Lecture.

Takase, M., et al., "Plasma doping Technology for the MOS transistor with a channel length below 0.15 µm", Applied Physics, 1999, vol. 68 No. 5.

Sasaki, Y., et al., "Nondestructive Beam Current Monitor Using DC SQUID", pp. 68-76.

Kobayashi, K., et al., "Three-Dimensional Plasma Doping for Beam-Channel Transistor", 29p-ZG-13, Preprints of the 51st Spring meeting of the Japan Society of Applied Physics and Related Societies, Mar. 2004, Tokyo University of Technology.

Sato, T., et al., "Effect of wet cleaning treatment on dose of impurity after plasma doping", 29p-ZG-14, Preprints of the 51st Spring meeting of the Japan Society of Applied Physics and Related Societies, Mar. 2004, Tokyo University of Technology.

Takagi, K., et al., "Profile control by Helium plasma treatment in plasma doping method", 29p-ZG-15, Preprints of the 51st Spring meeting of the Japan Society of Applied Physics and Related Societies, Mar. 2004, Tokyo University of Technology.

Okashita, K., et al., "In-situ Plasma Pre-amorphization for Shallow Junction Formation", 3p-P10-14, Preprints of the 65th Meeting of the Japan Society of Applied Physics and Related Societies, Sep. 2004, Tohoku Gakuin University.

Nakazawa, H., et al., "Characterization of Boron/Phosphorus Layer by Cold/Heat Ion Implantation", 3p-P10-15, Preprints of the 65th Meeting of the Japan Society of Applied Physics and Related Societies, Sep. 2004, Tohoku Gakuin University.

Kobayashi, K., et al., "Doping Profile Evaluation for Three-Dimensional Transistor", 3p-P10-16, Preprints of the 65th Meeting of the Japan Society of Applied Physics and Related Societies, Sep. 2004, Tohoku Gakuin University.

Otakagi, K., et al., "Effect on Impurity profile of Helium Plasma Treatment on a Plasma Doping Method", 65th Japan Society of Applied Physics Symposium Collection of Lectures, Sep. 2004, Tohoku Graduate Department.

Sauddin, H., et al., "Leakage Current in Mesa-type p+/n, Junctions Formed by Plasma Doping", 10a-A-10, PerPreprints of the 66th Meeting of the Japan Society of Applied Physics, 2005, Tokushima University.

Fukagawa, Y., et al., "Electrical Properties of ultra-Shallow p+ Layers Formed by Plasma Doping", 10a-A-11, PerPreprints of the 66th Meeting of the Japan Society of Applied Physics, 2005, Tokushima University.

Matsuda, T., et al., "Chemical Bonds of Boron Atoms Implanted in A Silicon Surface by Plasma Doping", 10a-A-12, PerPreprints of the 66th Meeting of the Japan Society of Applied Physics, 2005, Tokushima University.

Mizuno, B., et al., "Reduction of lattice defect in Si layer on buried oxide by implantation of hydrogen,", SDM 87-169, Basic Research Lab., Semiconductor Research Center, Matsushita Electric industrial Co., Ltd.

Mizuno, B., et al., "ECR Plasma Doping", SDM 88-95, Semiconductor Research Center, Semiconductor Basic Research Lab., Matsushita Electric industrial Co., Ltd.

Mizuno, B., et al., "ECR Plasma Doping", Electronic Material, Dec. 1987.

Mizuno, B., "Plasma Doping Technology", Semiconductor Research Center, Matsushita Electric industrial Co., Ltd.

Nakada, K., et al., "D-259 Development of Cleanroom Auto Control System", 1994 Spring Conference of the Society of Electronic information and Communications.

Mizuno, B., et al., "Behavior of Implanted Ions Near the Surface—Outer Diffusion and Self-sputtering", 28p-ZL1.

Yamanishi, Y., et al., "Behavior during Oxidation of Nitrogen Introduced by Ion Implantation", 28p-ZL2.

Zaizu, Y., et al., " Effects of Silicon Nitride Films on Boron Enhanced Diffusion and Crystalline Defects due to Boron Implantation", 28p-ZL3.

Mizuno, B., et al., "Behavior near Surface of Implanted Ions (cont'd) Self-sputtering and Back-scattering", 20p-ZE-11.

Kinoshita K., et al., "Optical Changes in Association with Crystalline Damage due to Low Energy Ion Implantation (IV)", 20p-ZE-12.

Hasegawa, K., et al., "Dual Species (B, As) Implantation in Silicon", 28p-ZE-13.

Sato, T., et al., "Dose Volume changes and HF Cleansing Before and After Plasma Doping Change dose caused by HF treatment before and after plasma doping", 1a-A-11, 64th Applied Physics Lecture Series—Lecture Manuscripts, 2003, Fukuoka University.

Susuki, K., "High Tilt Angle Ion Implantation in Polycrystalline Si, High tilt angle ion implantation into Polycrystalline silicon", 1p-A-1, 64th Applied Physics Lecture Series—Lecture Manuscripts, 2003, Fukuoka University.

Yamada, M., et al., "Evaluation of Junction Leak Current Caused by Element Isolation Stress, Study of junction leakage currents induced by the stress of shallow trench isolation", 1p-A-2, 64th Applied Physics Lecture Series—Lecture Manuscripts, 2003, Fukuoka University.

Aiba, I., et al., "Dose Variation by Chemical Cleaning Process after Plasma Doping", 3p-P10-18, 65th Japan Society of Applied Physics Symposium Collection of Lectures, Sep. 2004, Tohoku Graduate Department.

Majima, M., et al., "Hall Effect Measurement of ultra Shallow $p^+$ n Junctions formed by Plasma Doping", 3p-P10-19, 65th Japan Society of Applied Physics Symposium Collection of Lectures, Sep. 2004, Tohoku Graduate Department.

Masuda, T., et al., "Amorphization of Large-scale Silicon Substrate by using hybrid Quantum Chemical Molecular Dynamics Method", 1a-YE-7, 52nd Japan Society of Applied Physics Symposium Collection of Lectures, 2005, Saitama University.

Fukugawa, Y., et al., "Examination of pre-amorphous layer formation process by He plasma irradiation", 1a-YE-8, 52nd Japan Society of Applied Physics Symposium Collection of Lectures, 2005, Saitama University.

Aiba, I., et al., "Plasma Doping on Si substrates with Resist Patterns", 1a-YE-9, 52nd Japan Society of Applied Physics Symposium Collection of Lectures, 2005, Saitama University.

Okashite, K., et al., "Ultra Shallow Junction Formation with Plasma Doping and Spike RTA", 1a-YE-10, 52nd Japan Society of Applied Physics Symposium Collection of Lectures, 2005, Saitama University.

Sauddin, H., "Leakage Current Characteristics of Ultra-shallow p+/n Junctions Formed by Plasma Doping", 1a-YE-11, 52nd Japan Society of Applied Physics Symposium Collection of Lectures, 2005, Saitama University.

Matsuno, A., et al., "One Dimensional Thermal Diffusion Simulation for the USJ formation by green laser anneal with absorption layer", 16-YE-1, 52nd Japan Society of Applied Physics Symposium Collection of Lectures, 2005, Saitama University.

Mizuno, B., et al., "ECR Plasma Doping", Matsushita Electric Industrial Co., Ltd.

Higaki, R., et al., "Effects of gas phase absorption into Si substrates on plasma doping process".

Lenoble, D., et al., "Fabrication of 60-nm plasma doped CMOS transistors", 2002, IEEE.

Severi, S., et al., "Diffusion-less junctions and super halo profiles for PMOS transistors formed by SPER and FUSI gate in 45nm physical gate length devices", 2004, IEEE.

Talwar, et al., "Study of Laser Thermal Processing (LPT) to Meet Sub 130nm Node Shallow Junction Requirements", 2000, pp. 175-177.

Ito, et al., "Flash Lamp Annealing Technology for Ultra-shallow Junction Formation", Extended Abstract of International Workshop on Junction Technology, 2002, pp. 23-26.

Kagawa et al., Influence of Pulse Duration n KrF Excimer Laser Annealing Process for Ultra Shallow Junction Formation, Extended Abstract of International Workshop on Junction Technology, 2002, pp. 31-34.

Yamamoto et al., Impact of Pre-Atmorphization for the Reduction of Contact Resistance Using Laser Thermal Process, extended Abstract of International Workshop on Junction Technology, 2002, pp. 27-30.

European Supplementary Search Report, with Written Opinion, issued in European Patent Application No. EP 04773759.8/1672683 dated on Sep. 2, 2008.

Ito et al " 10-15nm Ultrashallow Junction Formation byFlash-Lamp Annealing" pp. 2394-2398 Japanese Journal of Applied Physics, Tokyo, Japan vol. 41, No. 4b Sep. 26, 2001.

* cited by examiner

AFTER GATE ETCHING

LONG ← SHORT → LONG

PLASMA DOPING

LARGE ← SMALL → LARGE

BEFORE LASER IRRADIATION

SHORT ← LONG → SHORT

NON UNIFORMITY OF FLASH LAMP

STRONG ← WEAK → STRONG

METHOD AND APPARATUS OF FABRICATING SEMICONDUCTOR DEVICE

RELATED APPLICATIONS

This application is a national phase of PCT/JP2005/008695 filed May 12, 2005, which claims priority from Japanese Application No. 2004-145388 filed May 14, 2004, the disclosures of which Applications are incorporated by reference herein. The benefit of the filing and priority dates of the International and Japanese Applications is respectfully requested.

TECHNICAL FIELD

The present invention relates to a method and an apparatus of fabricating a semiconductor device, particularly to a method of eliminating variations in the consistency of semiconductor devices such as transistors on a semiconductor wafer or on liquid crystals, and to an apparatus of implementing the solution.

BACKGROUND OF THE INVENTION

In recent years, with the realization of downsizing and greater packaging density of semiconductor devices, semiconductor elements such as transistors mounted on the semiconductor device are increasingly miniaturized in size.

In fabrication of the transistor, a distinguishing factor that decides the properties is gate length. In microfabrication that decides the gate length, photolithography and etching are used. In photolithography, a photosensitive resin (photoresist) is applied over a semiconductor substrate 100 such as a silicon wafer, and the substrate is exposed at each of predetermined units such as a chip for sequential patterning. The pattern thus formed is developed to form a resin pattern (resist pattern), and the resin pattern is used as a mask for dry etching, for example. In dry etching, the entire surface of the silicon wafer is processed in plasma to etch the silicon material in the area in which no resin pattern is left. Here, the cross sectional structure is schematically shown in FIGS. 4(*a*) and 4(*b*). A gate insulating film 110 formed of a silicon oxide film is formed on the semiconductor substrate 100 such as a silicon wafer, polysilicon or a metal material 120 to be a gate electrode is deposited thereon, and then a resin pattern 130 is formed by lithography process steps (FIG. 4(*a*)). In this state, the semiconductor substrate 100 is brought into a plasma chamber, and an etchant gas, suited for polysilicon or the metal material 120 that is an etching target material, is used for sequential dry etching (FIG. 4(*b*)).

Then, typically, the pattern of the gate electrode thus formed is used as a mask to dope an impurity material that provides positive or negative properties (to silicon) in a self-aligned manner, and source/drain regions 140 and 150 are formed.

The distance between the source/drain regions thus formed becomes effective gate length. Therefore, the effective gate length is decided by the pattern accuracy of the gate electrode and by the impurity doping accuracy in fabrication thereof.

At first step, in lithography for use in forming the gate electrode, since the substrate is processed highly accurately in units of chips in the size about a 1 cm×1 cm square, it is ideally finished in accuracy with no variations. However, in reality, because variations are sometimes generated in the resin coating thickness in the center part and in the peripheral part of the silicon wafer, slight variations may be generated. On the other hand, in dry etching, since the semiconductor substrate is batch processed in an etching chamber having a limited volume, certain variations are always generated. For example, this becomes a few percentage of variations among silicon wafers or in the surface of a 300 mm silicon wafer.

The gate length described here distinguishingly decides the performance of the transistor, ideally, it is necessary to form the gate length uniformly throughout the surface of a 300 mm wafer.

DISCLOSURE OF THE INVENTION

Problems that the Invention is to Solve

When the gate length becomes shorter, there are tendencies that threshold voltage drops and the switching performance of the transistor is improved, but leakage current is increased in the off state. In reverse, when the gate length is long, the switching performance is decreased. As discussed above, in dry etching which is done with plasma in certain size, variations tend to be generated in the surface of a silicon wafer. In device design, these variations are taken into account to set margins. However, with the advance of miniaturization, in the current state, it becomes difficult to provide margins.

In addition, as shown in FIG. 5, in the transistor, a source region 140 and a drain region 150 are formed as they sandwich a gate electrode 120. They are a source and a drain for carriers such as electrons and holes, and carriers are moved from the source region 140 toward the drain region 150. In recent years, the source/drain regions are formed of two stages of a shallow, low concentration area and a deeper, high concentration area, called an extension 160, and such transistors are widely used that is formed of a so-called LDD (Lightly doped diffusion layer) structure.

In this case, the distance between the extensions 160 is the effective channel length, and the area surrounded by the extensions 160 decides the performance as a channel region. As shown in FIG. 5, the channel region is formed as it overlaps under the gate electrode. As described above, this is formed by doping an impurity material. Generally, when the amount of an impurity is large, the extension of diffusion is increased in the lateral direction, the overlap (Xj) in the lateral direction is increased, the gate length is shortened effectively, and the junction depth (Yj) in the vertical direction is increased for improved switching speed, whereas the leakage current is raised. In reverse, when the doped amount of an impurity is small, the extension of diffusion in the lateral direction is decreased and the effective gate length is longer. In recent years, ion implantation is used for impurity doping. The ion implantation is a scheme in which a beam containing a desired impurity is formed and the entire surface of the substrate is electromagnetically or mechanically scanned by the beam for doping. Therefore, consistency in the surface is remarkably excellent with almost no variations.

In addition, when a plasma doping method with plasma is used in impurity doping, a sample is exposed in a plasma atmosphere as similar to dry etching. Thus, in principles, the same variations are generated as those in dry etching. The variations in two processes are combined to make it difficult to estimate the results, leading to the necessary consideration of greater margins.

Moreover, after impurity doping, it is necessary to conduct so-called activation annealing in which energy is applied to substrate constituent atoms to cause the doped impurity to be in the electrically active state in silicon. To this end, for example, infrared rays are applied by a halogen lamp to provide thermal energy to recover crystallizability, and impurities are arranged in correct positions in a crystalline lattice for electrical activation. Generally, the annealing method like this sometimes has some nonuniformaity because irradiations are applied onto the entire substrate, or the substrate is heated in general.

The invention has been made in view of the circumstances. An object is to provide a method and an apparatus of fabricating a semiconductor device with uniform, small property variations.

Particularly, an object is to reduce variations in the gate length of a transistor.

Means for solving the problems

Then, a method according to the invention is a method of fabricating a semiconductor device in which a plurality of semiconductor devices is formed on a substrate, the method including: doping an impurity so as to cancel a parameter expressing in-plane nonuniformaity of pattern dimensions in the substrate.

According to the method, the state of the impurity, that is, the extension of diffusion length and the like are adjusted to cancel dimensional variations. Therefore, variations in the transistor properties, particularly variations in the effective gate length can be reduced.

In addition, a method according to the invention is a method including the steps of: forming a plurality of patterns of gate electrodes on a surface of a semiconductor substrate; and adjusting a doping condition for source/drain regions so as to equal an effective channel length in accordance with dimensions of the pattern obtained in the forming step.

According to the method, even when the dimensional variations in the substrate cause variations in the gate length in the processing step, the extension of diffusion length is adjusted to make the effective gate length uniform. In addition, when variations are generated in the effective channel length, a channel impurity concentration is adjusted to allow adjustment. In addition, here, the semiconductor substrate includes a substrate on which a semiconductor layer such as amorphous silicon is formed on a glass substrate, in addition to a silicon substrate.

In addition, a method according to the invention is a method in which in the doping step, in consideration of in-plane nonuniformaity of the gate pattern caused by lithography and dry etching, an impurity is doped so as to cancel a parameter expressing in-plane nonuniformaity.

According to the method, in consideration of the in-plane nonuniformaity of the gate pattern caused by lithography and dry etching, in doping for forming the source/drain regions, a relatively small amount is doped in the area having a short gate length, whereas a relatively large amount is doped in the area having a long gate length, whereby the doping conditions in source/drain diffusion are adjusted to easily adjust the effective gate length. On the other hand, an impurity concentration in the channel region may be adjusted by adjusting threshold voltage and switching speed by doping, thereby allowing adjustment. Both adjustments are combined to intend further consistency of the transistor properties.

In addition, a method according to the invention is a method in which in the doping step, plasma doping is used to form a plasma distribution that is to cancel in-plane nonuniformaity, and nonuniformaity is eliminated by doping.

According to the method, the plasma distribution is adjusted to easily eliminate the in-plane nonuniformaity of the effective gate length.

In addition, a method according to the invention is a method in which in the doping step, an ion implantation method is used to control scanning operation so as to eliminate in-plane nonuniformaity.

According to the method, beam current or a dose amount in ion implantation is controlled to easily eliminate the in-plane nonuniformaity of the effective gate length.

In addition, a method according to the invention is a method in which after the doping step, the step of annealing is included in which a distribution is provided in a semiconductor substrate so as to cancel a parameter expressing remaining nonuniformaity in the substrate.

According to the method, only the annealing condition is adjusted to suppress variations in the effective gate length.

In addition, a method according to the invention is a method in which in the annealing step, short and long gate lengths are parameters expressing nonuniformaity in the substrate, and in-plane nonuniformaity of a substrate is cancelled by applying laser with relatively small power onto a substrate portion having a short gate length whereas by applying laser with relatively large power onto a substrate portion having a long gate length.

According to the method, only the laser irradiation condition is adjusted to suppress variations in the effective gate length.

In addition, a method according to the invention is a method in which the annealing step includes two steps of annealing, including: annealing under a first condition; and annealing under a second condition so as to cancel a parameter expressing nonuniformaity generated in annealing under the first condition.

According to the method, since adjustment is done at two steps, more highly accurate adjustment is allowed.

In addition, a method according to the invention is a method in which in consideration of in-plane nonuniformaity of the gate pattern caused by lithography and dry etching, the step of activating an impurity so as to cancel a parameter expressing in-plane nonuniformaity in a substrate caused by lithography and dry etching.

According to the method, the activation condition is adjusted to easily to suppress variations in the gate length caused by the in-plane nonuniformaity of the gate pattern to make the effective gate length uniform.

In addition, a method according to the invention is a method in which in-plane nonuniformaity of a substrate caused by dry etching is adjusted so as to cancel in-plane nonuniformaity of an annealing apparatus.

According to the method, even when the annealing apparatus has nonuniformaity, gate dimensions are adjusted for processing so as to cancel the in-plane nonuniformaity in which a gate length can be etched short in a portion having low irradiation power whereas a gate length can be etched long in a portion having a relatively high power, whereby variations in the effective gate length can be suppressed.

In addition, an apparatus of fabricating a semiconductor according to the invention is configured to adjust an etching, doping or annealing condition in the surface of a substrate.

In addition, an apparatus of fabricating a semiconductor according to the invention includes a measuring mechanism which measures gate dimensions.

In addition, an apparatus of fabricating a semiconductor according to the invention includes a measuring mechanism which measures an impurity distribution.

Figure 1:
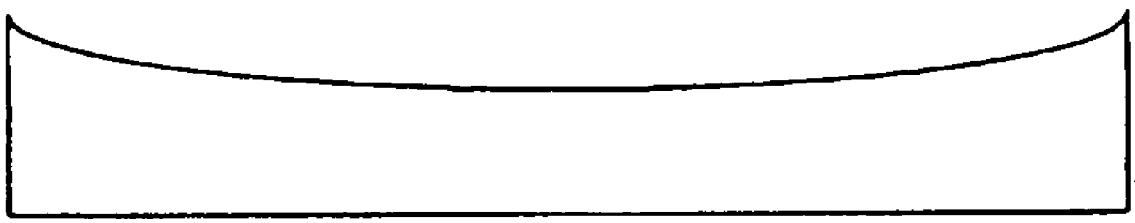
FIG. 1 shows diagrams illustrative of the in-plane nonuniformity in dry etching and doping; (a) shows a diagram depicting the length of gate length after dry etching, and (b) shows a diagram depicting the in-plane distribution of the doped amount after plasma doping.
Figure 1:
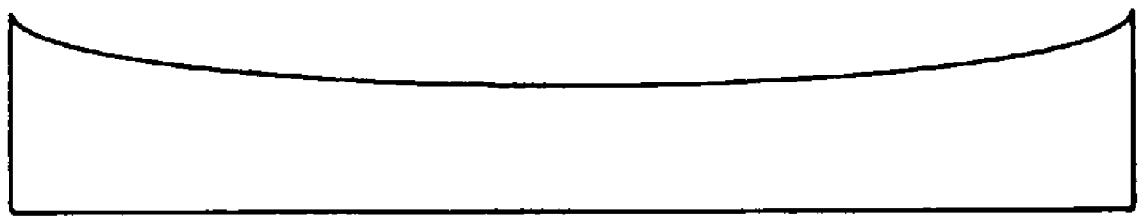

DESCRIPTION OF NUMERALS AND SIGNS 100 silicon
110 gate insulating film
120 gate electrode
130 photoresist
140 source electrode
150 drain electrode
160 extension
170 gate length

BEST MODE FOR CARRYING OUT THE INVENTION

Hereinafter, the embodiments of the invention will be described in detail with reference to the drawings. It was found that process conditions are decided so that a reduction is intended in variations in a semiconductor device, particularly in the gate length of a transistor, variations in the gate dimensions or variations in impurity implantation are considered to cancel these variations. In a method according to the invention, the method is mainly categorized into three methods below.

First, it is a method in which nonuniformaity owned by plasma is used to adjust the in-plane distribution of plasma so as to cancel variations in dimensional accuracy and to equal the effective channel length.

Secondly, it is a method in which impurity implantation is conducted to a substrate to lead to nonuniformity prior to annealing, and the substrate in this state is electrically activated under different annealing conditions for each part of the substrate.

Thirdly, it is a method in which in consideration of non-uniformaity of annealing technique, a process right before annealing, that is, process steps of dry etching and doping are mainly adjusted so as to finally eliminate the nonuniformity.

First, in short, in the first method, the consistency of plasma doping is adjusted, or two plasmas are matched with each other so as to cancel the in-plane distribution of plasma for etching a gate electrode.

In the second method, in-plane variations are grasped that relate to the performance of a transistor prepared right before annealing, and annealing is conducted in such a way that less powered energy is applied to the part in a substrate in which the gate length effectively becomes longer and relatively greater powered energy is applied to the part of the substrate in which the gate length effectively becomes shorter so as to cancel the result of in-plane variations obtained when it is assumed that the substrate is annealed so as to provide ideal in-plane consistency.

In the third method, dry etching conditions or doping conditions are adjusted so as to cancel in-plane nonuniformity in annealing process steps. More specifically, in annealing technique to apply irradiation throughout the surface, such as a technique group called lamp annealing, spike annealing, and flash lamp annealing, beams are generally applied onto throughout a substrate to conduct annealing process steps while high yields are maintained. The light source for annealing has dimensional constraints, leading to the in-plane non-uniformaity of the substrate to be a target. In order to solve such nonuniformaity caused by the light source, conditions are set so as to cancel the nonuniformity of the light source to conduct dry etching and doping process steps.

Embodiment 1

Figure 5:
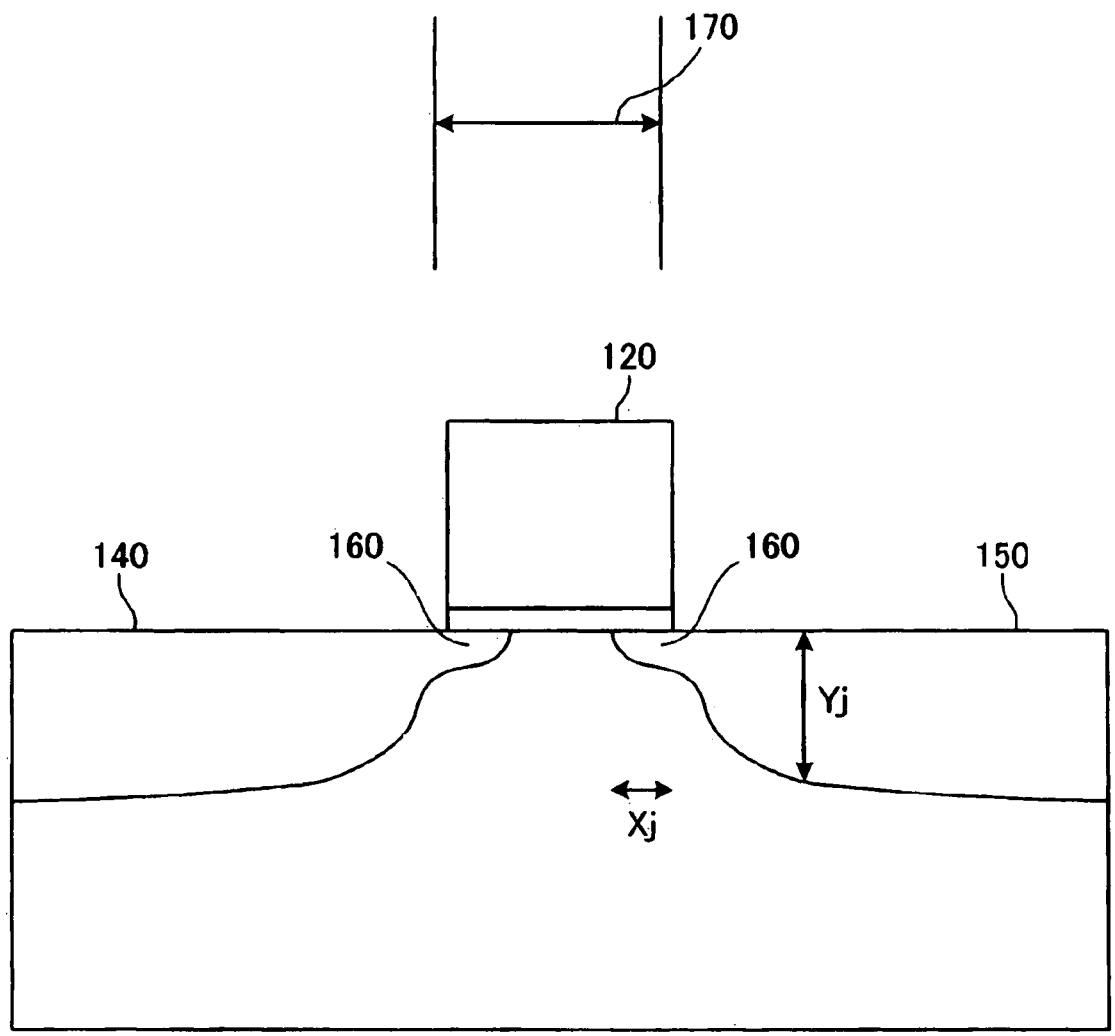
FIG. 5 shows a cross section depicting the structure for illustrating the process steps in fabricating a transistor more specifically.

A silicon substrate is in a circular shape (wafer) and the diameter is standardized to 200 mm or 300 mm. Since the plasma process is conducted to the wafer, two-dimensional distribution is generally provided. Here, for simplified explanation, it will be described in one-dimensional distribution. As described in the cross section shown in FIG. 5, the pattern of the gate electrode is formed by dry etching materials such as polycrystalline silicon and metal, and the dimensions exhibit variations having dependence on the in-plane consistency of the substrate caused by dry etching. FIG. 1(a) shows the wafer in-plane distribution of dimensions (gate length) 170 shown in the cross section in FIG. 5. FIG. 1(a) shows the distribution in which the gate length is long as close to the outer rim of the wafer, and the gate length is relatively short neat the center part. In the actual process steps for the wafer in this state, after ashing by plasma oxidation (removal of a mask) and cleaning process steps in the liquid phase, a mask is formed by lithography process steps, as necessary, and then doping process steps are conducted. In order to solve nonuniformity in the previous dry etching process steps, the portion having a longer gate length is doped in a relatively large amount, whereas the portion having a shorter gate length is doped in a relatively small amount. Thus, the finished effective gate length is made uniform, and the distribution of transistor properties is made consistent.

In the embodiment, when the process steps are conducted, plasma doping using plasma is performed. In plasma doping, plasma always has nonuniformity (distribution). Here, the plasma nonuniformity is adjusted to intend to solve the nonuniformity of the effective gate length described above. Consequently, as shown in FIG. 1(b), plasma density generated in a chamber is adjusted to be high in the peripheral part of the wafer in such a way that a relatively large amount is doped on the outer rim side of the wafer whereas a relatively small amount is doped near the center part of the wafer. For example, plasma distribution is adjusted in such a way that a magnetic field externally applied is stronger in the wafer peripheral part.

A plasma processing apparatus using here may have a parallel plate electrode structure, which is provided with an adjusting mechanism configured to adjust applied voltage for each area, in which applied voltage can be adjusted to be high in the peripheral part.

Then, finally, annealing was conducted for activating an impurity.

Consequently, 1% of variations or below in the gate length was obtained in the surface of the wafer, and consistency was significantly improved. In addition, this method is used to improve the consistency of transistor properties, and a sufficient performance can be obtained for fabricating semiconductor devices.

Embodiment 2

In the embodiment 1, the dry etching conditions and the plasma doping conditions are combined to fabricate a transistor having considerable consistency. However, 1% of variations still remains. In order to more completely solve the variations, here, a method will be described in which laser is used to adjust the annealing condition for more improved consistency.

Laser beams have aligned wavelengths, having a merit that beams of the optimum wavelength can be applied onto the substrate, whereas having a demerit that it is difficult to apply beams onto a large area at the same time. Typically, laser beams extended on lines are scanned, or laser beams are applied onto small areas separately.

In the embodiment, the properties that separate irradiations are used to vary intensity, or a time period, or a wavelength for each of separate irradiations for optimum annealing, and variations in the performance of the transistor finally to be completed are made minimum.

Figure 2:
FIG. 2 shows a diagram depicting the nonuniformity of the effective gate length generated in the surface resulted from microfabrication (lithography and dry etching) and doping right before laser beam irradiation as annealing technique.

FIG. 2($a$) shows a distribution map as in-plane variations in the wafer are formed in one-dimensional distribution as similar to the embodiment 1, showing a diagram depicting the distribution of variations in the effective gate length in the surface of the wafer after doping and before annealing. It is shown from the drawing that the effective gate length is relatively long in the center part of the wafer, whereas it is relatively short in the peripheral part of the wafer. This is the result in consideration of the doping properties. For this, when laser is applied, laser intensity was varied by 5% to apply laser between the center part of the wafer with the longest effective gate length and the peripheral part of the wafer with the shortest effective gate length. For example, the intensity was 1000 mJ/cm$^2$ in the center part, and 950 mJ/cm$^2$ in the peripheral part.

Due to the difference in irradiation intensity, the center part is annealed stronger to extend the diffusion length long, whereas in the peripheral part the extension is suppressed. Consequently, the effective gate length is shorter in the center part, whereas the peripheral part is annealed more softly, so that the effective gate length becomes longer. With this effect, 1% of variations before laser irradiation was able to be reduced to about 0.3% of variations.

In addition, instead of annealing methods in which laser is used for scanning at each area, such a annealing method is also proposed that it is essentially based on irradiation onto throughout the surface of the wafer with a flash lamp. This is important to improve productivity, but its meanings are dropped to half when variations in the transistor finally fabricated remain great. This is because sufficient yields cannot be obtained. Here, in applying the beams of a flash lamp or a tungsten halogen lamp, the beams can be applied onto the substrate separately for each area to vary the intensity at each irradiation. Accordingly, the effective gate length can be adjusted. As similar to the sample described above, for the substrate in which the effective gate length is relatively long in the center part of the wafer whereas it is relatively short in the peripheral part of the wafer, light intensity was able to be varied by 8% between the light intensity to the center part and the light intensity to the peripheral part.

In the case of annealing using a flash lamp, for example, it is considered that adjustment is allowed from 27 to 40 J/cm$^2$. To vary light intensity, an ND filter or an attenuator is used to allow highly accurate adjustment.

In this case, when beams are applied for a single chip each, light intensity becomes too strong because of the design of a light source. Thus, irradiation for every 25 chips is assumed in which the beams were shaped into a 5 cm×5 cm square for irradiation. Here, in response to laser intensity distribution, the unit of intensity of flash lamp annealing is adjusted while it is being monitored. For example, the scan rate of the flash lamp is decided so as to cancel variations in the intensity distribution of doping plasma. Thus, 1% of variations in the effective gate length of the substrate before annealing was able to reduce to about 0.5%. In addition, differences may be provided in light intensity within a 5 cm×5 cm square that is the unit irradiation area of the laser beams. When this is to perform, differences are provided in the surface of the filter that is designed in a 5 cm×5 cm square. Alternatively, when liquid crystals are used as the ND filter or attenuator, the flexibility of more dynamically forming differences is increased.

In addition, in the embodiment 2, laser intensity or lamp intensity is adjusted, but this scheme may be done in which intensity is made constant and a irradiation time period is adjusted.

Embodiment 3

In the embodiment 2, it is described that the irradiation area of the flash lamp is separated to adjust annealing. However, this causes a cost increase. Here, it is intended to adjust gate process conditions or impurity doping conditions so that the effective gate length finally obtained by annealing is constant, not by this scheme in which the nonuniformity of the flash lamp is known beforehand to adjust the flash lamp.

First, for a method of measuring the nonuniformaity of a flash lamp annealing apparatus, an oxidation rate is measured as described below. In this method, an oxidation atmosphere is first introduced into an apparatus for flash lamp annealing to oxidize the surface of a silicon substrate at a fixed temperature for a fixed time period.

In this manner, the film thickness of an oxide film is measured to know the distribution of the light quantity in the surface of the wafer. In addition, the two-dimensional distribution of the oxide film is measured to detect the light quantity distribution of a lamp.

Figure 3:
FIG. 3 shows a diagram depicting the in-plane nonuniformaity of an annealed substrate, which is provided by a flash lamp, it is supposed that a flash lamp is used for annealing technique, for example.
Figure 4:
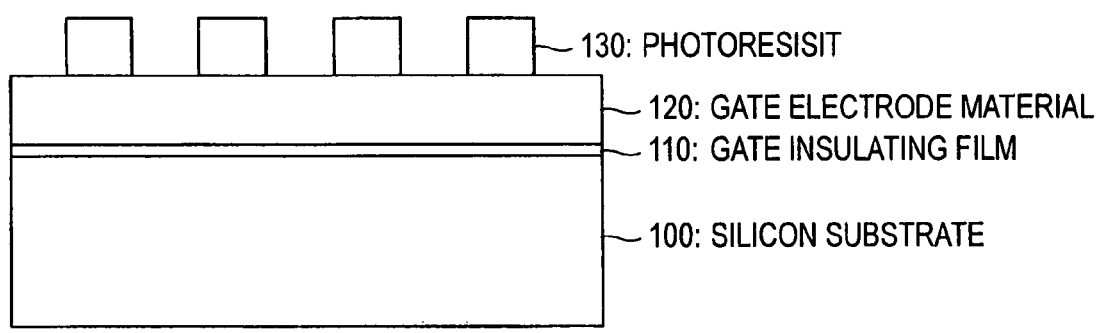
FIG. 4 shows cross sections depicting the structure for illustrating the basic process steps in microfabrication.
Figure 4:
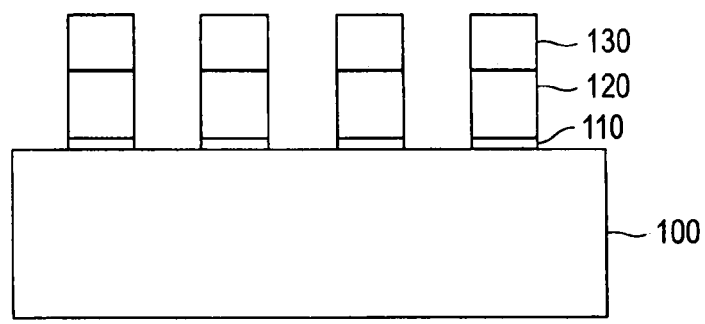

FIG. 3 shows an illustration one-dimensionally depicting the nonuniformaity of the flash lamp annealing apparatus used in the embodiment as similar to the embodiment 2. It is apparent from FIG. 3 that light intensity is relatively strong in the peripheral part of the wafer, whereas light intensity is relatively weak in the center part. About 2% of variations was observed in the entire surface of the wafer. Schemes to correct this are dry etching and plasma doping. Conditions are set to form the distribution in reverse to the variations so as to cancel the variations.

First, the distribution with 3% of variations was formed by dry etching. As shown in FIG. 1($a$), the gate length is relatively short in the center part of the wafer, whereas it is relatively long in the peripheral part. Plasma doping was conducted to the distribution to form variations in the effective gate length to be about 1.2%. Onto the substrate, the beams of the above described flash lamp having 2% of variations in intensity distribution were applied to reduce variations in the effective gate length, finally allowing the formation of 0.7% of intensity distribution or below as the transistor properties.

Embodiment 4

In this embodiment, a scheme will be described in which ion implantation is used for channel doping to compensate variations in the properties caused by variations in the effective gate length. In the embodiments so far, the schemes to reduce variations in the effective gate length are described such as doping for forming the source/drain regions. Here, not to reduce variations in the effective gate length, variations in the properties are compensated by channel doping for adjusting a threshold, while the effective gate length itself remains unchanged. Here, a reduction in variations in the properties by adjusting threshold voltage will be described, including doping for adjusting threshold voltage after forming the gate electrode.

As already described above, in the transistor having a relatively long gate length, the threshold is decreased to intend the improvement of a reduction in drive voltage and of switching speed. On the other hand, in the transistor having relatively a short gate length, the threshold is increased to suppress leakage current.

To this end, three types of doping can be controlled by ion implantation. One of them is source/drain formation using plasma doping already described. So far, in ion implantation for source/drain formation, it is called batch processing in which a few or a few tens of wafers were mechanically rotated at high speed and ion beams were applied onto all the wafers to secure consistency.

On the other hand, from now on, wafers are processed one by one for consistency. First, when a single wafer is scanned, adjustment is done for each wafer. For example, as similar to the embodiment 1, when the gate length distribution is short in the center part whereas it is relatively long in the peripheral part as shown in FIG. 1(a), a small amount is doped in the center part whereas a large amount is doped in the peripheral part so as to cancel the properties. There are two schemes to do so. A first scheme is a scheme in which a scan rate for the center part is increased whereas the scan rate for the peripheral part is decreased. Furthermore, a second scheme is a scheme in which the beam current value is made small in scanning the center part whereas the beam current value is made great in scanning the peripheral part.

In addition, when ion implantation energy is high, ions penetrate into the substrate deeply. This reaction leads to a short effective channel length. Therefore, it may be coped in such a way that acceleration voltage is varied so that energy is high in the peripheral part whereas energy is low in the center part.

For measuring beam current to do so, a beam current measuring apparatus provided with a magnetic shielding part using a superconductor can be used for measurement (Japanese Patent Application No. 2003-71028). The beam current measuring apparatus is characterized by including a magnetic field sensor and the magnetic shielding part formed of the superconductor in which a gap is provided to magnetically shield the magnetic field sensor from the space through which ion beams flow. More specifically, the apparatus is configured to have a sensing coil which is disposed on a path of beams to be measured, a SQUID which is a magnetic field sensor configured to detect a magnetic field corresponding to beam current, a washer coil which is a magnetic flux transmitting part configured to transmit magnetic flux detected by the sensing coil to a measuring part, and the measuring part having a superconductor device which senses the transmitted magnetic flux, a feedback coil which carries feedback current so as to cancel the change in magnetic flux penetrating through the superconductor device, a SQUID input coil and the SQUID. The output of SQUID is guided to an output terminal through a preamplifier and an integrator, and is fed back to the feedback coil through a feedback resister.

Here, for the sensing coil, a coil is used in which a super conductive wire is wound over a soft magnetic material core in which a magnetic field generated by beam current is collected by the soft magnetic material core to induce superconductive current on the coil. The superconductive current induced on the coil is transmitted to a coil disposed adjacent to the SQUID. In response to the change in beam current, superconductive current carried through the coil is varied to change the amount of magnetic flux penetrating through the SQUID. However, this configuration is provided in which feedback current is carried through the feedback coil so as not to change the amount of magnetic flux penetrating through the SQUID and so as to cancel the change. The feedback current is proportional to the change in the beam current value, and the feedback current is measured to detect a change in the beam current value in high accuracy.

The method like this is used to allow further highly accurate measurement. Then, this measuring method is used to measure output current, and beam current having a desired, adjusted output current value is used to conduct highly accurate ion implantation. Here, the threshold is adjusted by ion implantation for adjusting the threshold which is conducted prior to the formation of the gate electrode, whereby the gate length is effectively adjusted.

In this case, channel impurity concentration is adjusted so that the threshold is high in the center part whereas the threshold is low in the peripheral part. The similar threshold adjustment can be similarly conducted for control over so-called pocket implantation (or called halo implantation) to restrict source/drain extension after the gate electrode is formed. These three types of control, source/drain extension implantation, threshold adjusting implantation, and pocket implantation (or called halo implantation), were combined to control variations in a transistor to be below 1% in the wafer.

In addition, since ion implantation is used for source/drain (and extension) to cause a reduction in throughput, cluster ions and the like are used to improve productivity, or of course, plasma doping is sued, or plasma doping is combined with cluster beams for effectiveness.

INDUSTRIAL APPLICABILITY

As described above, according to the invention, in-plane variations in the wafer, or in the substrate are reduced to intend to make properties uniform, and a high yield semiconductor process can be implemented. Therefore, the invention is useful not only for the fabrication of a semiconductor device demanded for consistent properties including the formation of a transistor on a semiconductor substrate such as a silicon substrate but also for the formation of a thin film transistor (TFT) on a liquid crystal substrate.

The invention claimed is:
1. A method of manufacturing a semiconductor device, comprising the steps of:
   (a) forming a plurality of gate electrodes on a semiconductor substrate, the plurality of gate electrode have a first portion with a larger gate length and a second portion with a smaller gate length due to in-plane non-uniformity pattern size;

(b) forming plasma and controlling a plasma density of the plasma over the plurality of gate electrodes so as to provide non-uniform plasma having higher different plasma densities over the plurality of gate electrodes, such that a plasma density over the first portion is higher than a plasma density over the second portion; and (c) doping the semiconductor substrate with impurities by a plasma doping process using the plurality of gate electrodes as a mask in the non-uniform plasma, wherein in the step (c), an amount of dopant doped by the plasma doping process in the first portion with a larger gate length is larger than an amount of dopants doped by the plasma doping process in the second portion with a smaller gate length.

2. The method according to claim 1, wherein the step (c) is performed so as to form approximately uniform effective gate lengths between the first portion and the second portion by cancelling a difference in gate length between the first portion and the second portion by controlling amount of the dopants doped in the first portion and the second portion during the plasma doping process.

3. The method according to claim 1, wherein the semiconductor substrate is a wafer; and wherein in step (a), the plurality of gate electrodes have the non-uniform pattern size, in which the gates are larger in closer proximity of the outer edge of the wafer and are smaller near the center of the wafer.

4. The method according to claim 3, wherein in the plasma doping of step (c), the impurity doping in a relatively larger quantity is performed on the outer periphery of the wafer and the impurity doping in a relatively smaller quantity is performed near the center of the wafer.

5. The method according to claim 3, wherein in the plasma doping of step (c), a plasma density generated in a chamber is higher on the outer periphery of the wafer.

6. The method according to claim 3, wherein in the plasma doping of step (c), a magnetic field applied from the outside is stronger on the outer periphery of the wafer.

* * * * *